United States Patent [19]

(12) United States Patent
Hattori et al.

(10) Patent No.: US 10,629,350 B2
(45) Date of Patent: Apr. 21, 2020

(54) FLEXIBLE INDUCTOR

(71) Applicant: Murata Manufacturing Co., Ltd., Kyoto-fu (JP)

(72) Inventors: Masashi Hattori, Nagaokakyo (JP); Koichi Yamaguchi, Nagaokakyo (JP); Hideji Kihara, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 109 days.

(21) Appl. No.: 15/866,201

(22) Filed: Jan. 9, 2018

(65) Prior Publication Data

US 2018/0211754 A1 Jul. 26, 2018

(30) Foreign Application Priority Data

Jan. 20, 2017 (JP) ................................. 2017-008765

(51) Int. Cl.
| | |
|---|---|
| H01F 5/00 | (2006.01) |
| H01F 17/00 | (2006.01) |
| H01F 27/29 | (2006.01) |
| H05K 3/30 | (2006.01) |
| H05K 1/02 | (2006.01) |
| H05K 1/03 | (2006.01) |
| H01F 17/04 | (2006.01) |

(52) U.S. Cl.
CPC ......... *H01F 17/0006* (2013.01); *H01F 5/003* (2013.01); *H01F 17/0013* (2013.01); *H01F 17/04* (2013.01); *H01F 27/292* (2013.01); *H05K 1/028* (2013.01); *H05K 1/0393* (2013.01); *H05K 3/305* (2013.01); *H01F 2005/006* (2013.01); *H01F 2017/006* (2013.01); *H01F 2017/0066* (2013.01); *H01F 2017/048* (2013.01); *H05K 2201/055* (2013.01)

(58) Field of Classification Search
CPC ................................. H01F 2017/006
USPC ........................................... 336/200
See application file for complete search history.

(56) References Cited

U.S. PATENT DOCUMENTS

2005/0253677 A1* 11/2005 Ito ....................... H01F 17/0013
336/200
2008/0218301 A1* 9/2008 Yamaguchi ......... H01F 17/0013
336/83

FOREIGN PATENT DOCUMENTS

JP          2009-009985 A       1/2009

* cited by examiner

*Primary Examiner* — Ronald Hinson
(74) *Attorney, Agent, or Firm* — Studebaker & Brackett PC

(57) ABSTRACT

A flexible inductor includes a coil substrate having a first spiral conductor formed in or on a bottom surface, a first magnetic sheet laminated on a top surface of the coil substrate, and a second magnetic sheet laminated on the bottom surface of the coil substrate. The flexible inductor includes a plurality of outer electrodes including a first outer electrode and a second outer electrode that are disposed in a peripheral portion of the bottom surface of the coil substrate, and cutout portions each formed in an area between the first spiral conductor and each of the outer electrodes so as to penetrate through the coil substrate. The first outer electrode is electrically connected to an outermost end portion of the first spiral conductor. The second outer electrode is electrically connected to an innermost end portion of the first spiral conductor.

18 Claims, 5 Drawing Sheets

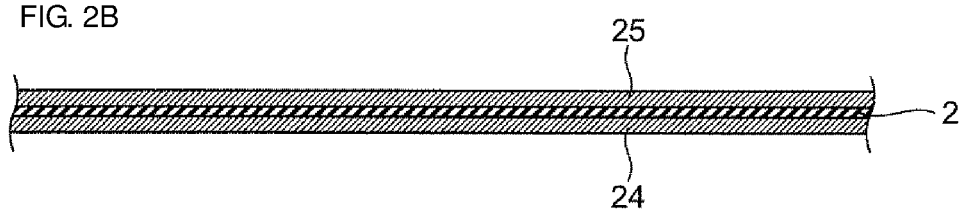
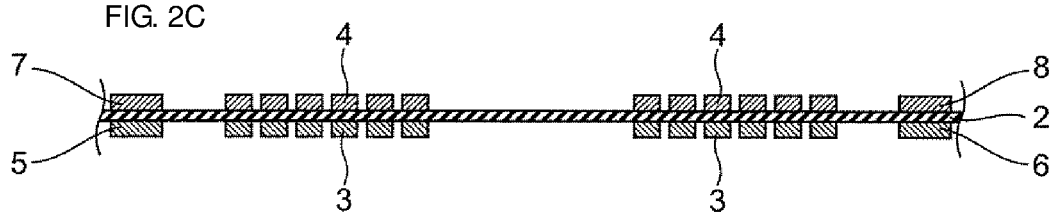
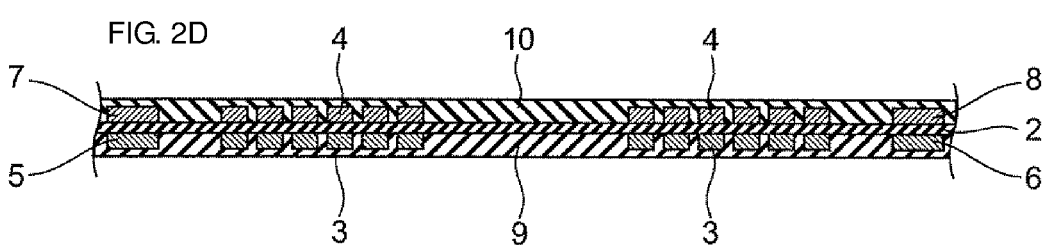
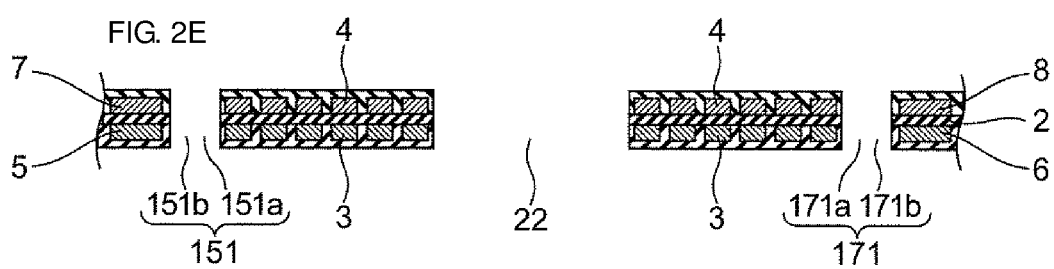
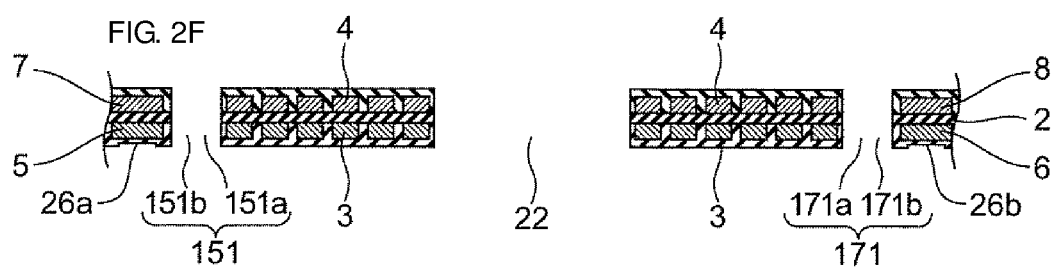
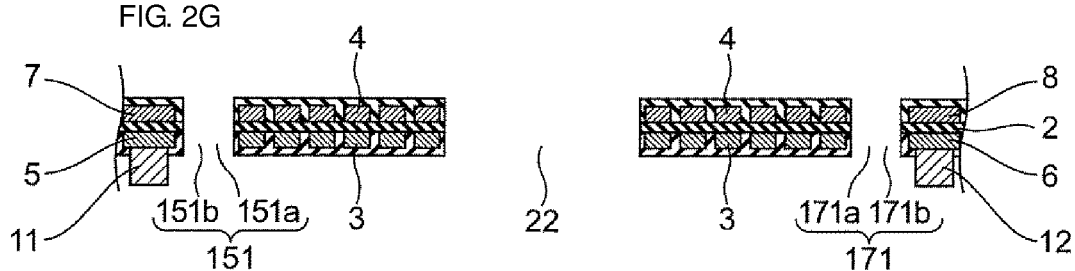

FLEXIBLE INDUCTOR

CROSS-REFERENCE TO RELATED APPLICATION

This application claims benefit of priority to Japanese Patent Application No. 2017-008765, filed Jan. 20, 2017, the entire content of which is incorporated herein by reference.

BACKGROUND

Technical Field

The present disclosure relates to a flexible inductor mounted on a flexible board.

Description of the Related Art

In recent years, inductors mounted on flexible boards are required to be small and slim, in accordance with reduction in the size and thickness of electronic equipment such as cellular phones. However, existing inductors use ferrite sintered bodies as a core element having high rigidity, and therefore are vulnerable to bending and drop impact.

For this problem, for example, Japanese Unexamined Patent Application Publication No. 2009-9985 describes a flexible inductor in which a composite magnetic sheet made of soft magnetic metal powder dispersed into a resin material is laminated on a film-shaped coil, as an inductor that is deformable in accordance with distortion of a flexible board and has a high resistance to drop impact, when the inductor is mounted on the flexible board.

In the flexible inductor according to the Japanese Unexamined Patent Application Publication No. 2009-9985, a conductive pattern is formed into a spiral shape in a plane, and an outermost end portion of the coil is connected to an outer electrode constituted of a so-called five-surface electrode, which covers an end surface of the flexible inductor in its width direction and part of four surfaces adjoining to the end surface, through an extended conductor. To mount the flexible inductor on the flexible board, the outer electrode is soldered to a mount terminal of the flexible board.

However, the flexible inductor according to the Japanese Unexamined Patent Application Publication No. 2009-9985 has a problem that, when the mounting flexible board is distorted, distortion stress concentrates on a joint portion between the extended conductor and the outer electrode and the joint portion tends to break. In the case of the five-surface electrode, in particular, since solder fillets are formed so as to contact side surfaces of the outer electrode, the distortion stress of the flexible board directly acts on the side surfaces of the outer electrode, thus causing large stress. This stress, which acts in the direction of stretching and shrinking the flexible board having the coil, makes the flexible inductor come unstuck specifically at the joint portion between the extended conductor and the outer electrode, owing to little stretchability of metal for forming the extended conductor.

As a method for reducing the distortion stress of the mounting flexible board, a method is usable in which the outer electrode is provided only in or on a bottom surface, i.e., mount surface of the flexible inductor, in order to eliminate the need for providing the solder fillets. However, in the case of the existing flexible inductor, the outer electrode is formed on the composite magnetic sheet. When the flexible inductor is mounted on the flexible board, since the outer electrode close contacts the composite magnetic sheet with weak strength, another problem occurs in which the outer electrode tends to come unstuck from the composite magnetic sheet.

SUMMARY

Accordingly, the present disclosure provides a flexible inductor which, when being mounted on a flexible board, is deformable by itself following temporal distortion of the flexible board and has a high resistance to drop impact.

To solve the above problems, according to a first aspect of the present disclosure, a flexible inductor includes a coil substrate having a first spiral conductor formed in or on a bottom surface, a first magnetic sheet laminated on a top surface of the coil substrate, and a second magnetic sheet laminated on the bottom surface of the coil substrate. The flexible inductor includes a plurality of outer electrodes including a first outer electrode and a second outer electrode that are disposed in a peripheral portion of the bottom surface of the coil substrate, and cutout portions each formed in an area between the first spiral conductor and each of the outer electrodes so as to penetrate through the coil substrate. The first outer electrode is electrically connected to an outermost end portion of the first spiral conductor. The second outer electrode is electrically connected to an innermost end portion of the first spiral conductor.

According to the first aspect, since stress applied to the coil substrate and the outer electrodes owing to distortion of the inductor is reduced, it is possible to improve resistance to mechanical impact and prevent a break in the coil substrate and a break in joint portions of the outer electrodes.

According to a second aspect of the present disclosure, one or more notch portions are formed in the area between the first spiral conductor and each of the outer electrodes. Providing the notch portions allows further reduction in the stress applied to the coil substrate and the outer electrodes, when distorting the inductor.

According to a third aspect of the present disclosure, the flexible inductor has a cutout remaining portion formed along an outer peripheral edge of the cutout portion in the area between the first spiral conductor and each of the outer electrodes, and the cutout remaining portion includes a plurality of beam portions each extending along the outer peripheral edge of the cutout portion to each of the outer electrodes. Deformation of the cutout remaining portion allows further reduction in the stress applied to the coil substrate and the outer electrodes, when distorting the inductor.

According to a fourth aspect of the present disclosure, each of the plurality of beam portions has one or more curved portions. The curved beam portion further improves flexibility in the cutout remaining portion, thus allowing a further increase in resistance to mechanical impact.

According to a fifth aspect of the present disclosure, an extended wiring is formed in or on one beam portion of the plurality of beam portions so as to connect between the first spiral conductor and the outer electrode. Forming the extended wiring in the beam portion improves flexibility in the extended wiring, thus allowing further prevention of a break in the joint portions of the outer electrodes.

According to a sixth aspect of the present disclosure, a first dummy wiring is formed in or on the bottom surface of another one of the beam portions except for the one beam portion of the plurality of beam portions having the extended wiring. An increase in the strength of the cutout remaining portion allows a further improvement in the flexibility of the cutout remaining portion.

According to a seventh aspect of the present disclosure, the coil substrate has a second spiral conductor formed in or on a top surface, and a second dummy wiring is formed in or on a top surface of at least one of the plurality of beam portions. Forming the second dummy wiring in or on the top surface of the beam portion allows further improvement in the strength of the cutout remaining portion.

According to an eighth aspect of the present disclosure, the outer electrodes are four outer electrodes disposed at four corners of the bottom surface of the coil substrate. Even when the inductor is distorted in any of an X direction and a Y direction, it is possible to reduce stress applied to the coil substrate and the outer electrodes.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 2B is a schematic cross sectional view showing the example of the manufacturing process of the flexible inductor according to the first embodiment of the present disclosure;

FIG. 2C is a schematic cross sectional view showing the example of the manufacturing process of the flexible inductor according to the first embodiment of the present disclosure;

FIG. 2D is a schematic cross sectional view showing the example of the manufacturing process of the flexible inductor according to the first embodiment of the present disclosure;

FIG. 2E is a schematic cross sectional view showing the example of the manufacturing process of the flexible inductor according to the first embodiment of the present disclosure;

FIG. 2F is a schematic cross sectional view showing the example of the manufacturing process of the flexible inductor according to the first embodiment of the present disclosure;

FIG. 2G is a schematic cross sectional view showing the example of the manufacturing process of the flexible inductor according to the first embodiment of the present disclosure;

DETAILED DESCRIPTION

Preferred embodiments of the present disclosure will be described below with reference to the drawings.

First Embodiment

A flexible inductor according to this embodiment includes a coil substrate having a first spiral conductor formed in or on a bottom surface, a first magnetic sheet laminated on a top surface of the coil substrate, and a second magnetic sheet laminated on the bottom surface of the coil substrate. The flexible inductor includes a plurality of outer electrodes including a first outer electrode and a second outer electrode that are disposed in a peripheral portion of the bottom surface of the coil substrate, and cutout portions each formed in an area between the first spiral conductor and each of the outer electrodes so as to penetrate through the coil substrate. The first outer electrode is electrically connected to an outermost end portion of the first spiral conductor. The second outer electrode is electrically connected to an innermost end portion of the first spiral conductor.

Figure 1A:
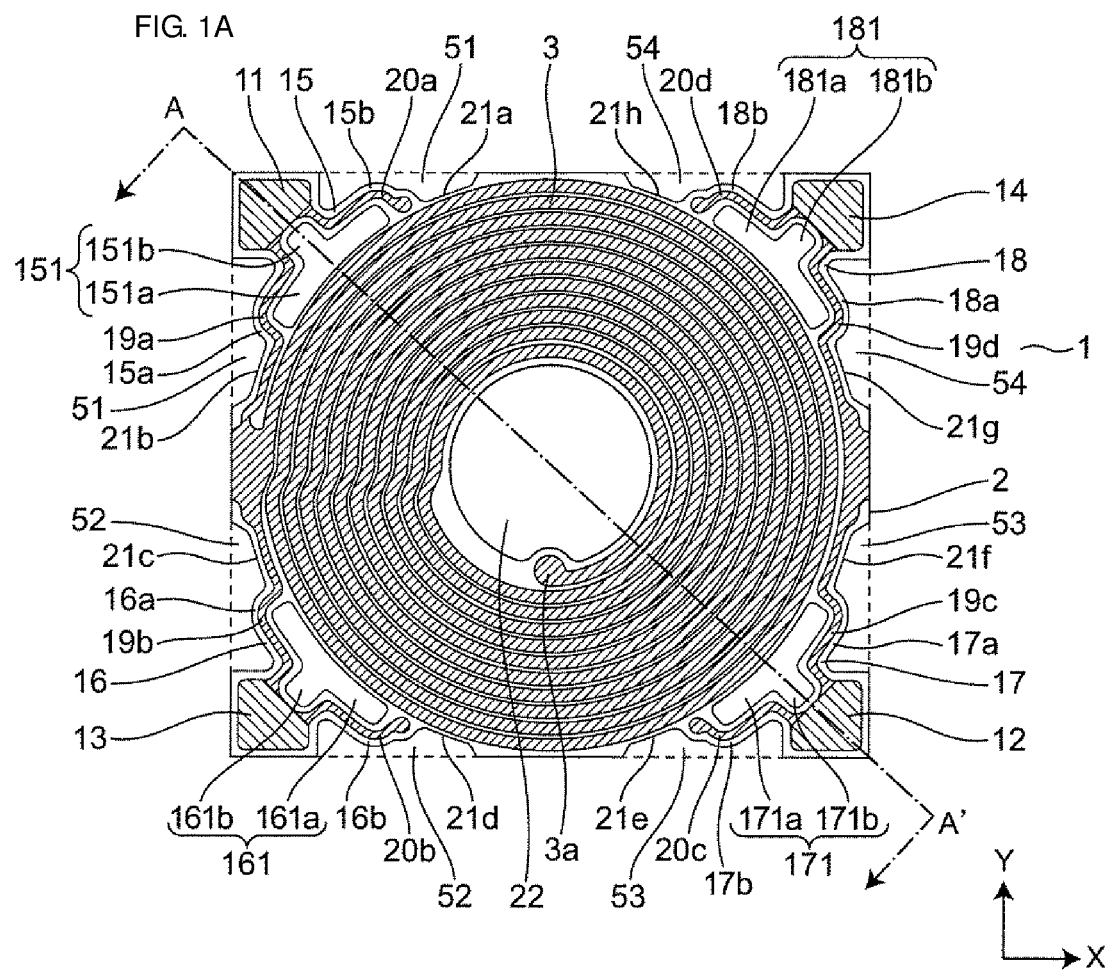
FIG. 1A is a bottom plan view showing an example of the structure of a coil substrate that constitutes a flexible inductor according to a first embodiment of the present disclosure.

FIG. 1A is a bottom plan view showing an example of the structure of the coil substrate that constitutes the flexible inductor according to this embodiment. A coil substrate 1 includes a substantially rectangular flexible board 2 having a cavity 22 in its middle portion, a first spiral conductor 3 formed on a bottom surface of the flexible board 2, and a first outer electrode 11, a second outer electrode 12, a third outer electrode 13 and a fourth outer electrode 14 formed, respectively, at the four corners of a peripheral portion of the bottom surface. In the top left corner of the coil substrate 1, a cutout portion 151 penetrating through the coil substrate 1 and a cutout remaining portion 15 extending along an outer peripheral edge of the cutout portion 151 to the first outer electrode 11 are formed in an area 51 between the first outer electrode 11 and the first spiral conductor 3. The cutout portion 151 is in a substantially step-like convex shape the top portion of which is disposed on the side of the first outer electrode 11, having a first step portion 151a as a base portion and a second step portion 151b as the top portion. On outer side portions of the cutout remaining portion 15, notch portions 21a and 21b are formed along the outer peripheral edge of the cutout portion 151. The cutout remaining portion 15 has two beam portions 15a and 15b that extend from the side of the first spiral conductor 3 along the outer peripheral edge of the cutout portion 151 to the first outer electrode 11. In or on the beam portion 15a, an extended wiring 19a is formed to electrically connect between a radial outermost end portion of the first spiral conductor 3 and the first outer electrode 11. On the other hand, a first dummy wiring 20a that is connected to the first outer electrode 11 at one end, though is not connected to another conductor in the same plane at the other end, is formed in or on the beam portion 15b.

In the bottom left corner of the coil substrate 1, a cutout portion 161 penetrating through the coil substrate 1 and a cutout remaining portion 16 extending along an outer peripheral edge of the cutout portion 161 to the third outer electrode 13 are formed in an area 52 between the third outer electrode 13 and the first spiral conductor 3. The cutout portion 161 is in a substantially step-like convex shape the top portion of which is disposed on the side of the third outer electrode 13, having a first step portion 161a as a base portion and a second step portion 161b as the top portion. On outer side portions of the cutout remaining portion 16, notch portions 21c and 21d are formed along the outer peripheral edge of the cutout portion 161. The cutout remaining portion 16 has two beam portions 16a and 16b that extend from the side of the first spiral conductor 3 along the outer peripheral edge of the cutout portion 161 to the third outer electrode 13. In or on the beam portion 16a, an extended wiring 19b is formed to electrically connect between the radial outermost end portion of the first spiral conductor 3 and the third outer electrode 13. On the other hand, a first dummy wiring 20b that is connected to the third outer electrode 13 at one end, though is not connected to another conductor in the same plane at the other end, is formed in or on the beam portion 16b.

In the bottom right corner of the coil substrate 1, a cutout portion 171 penetrating through the coil substrate 1 and a cutout remaining portion 17 extending along an outer peripheral edge of the cutout portion 171 to the second outer electrode 12 are formed in an area 53 between the second outer electrode 12 and the first spiral conductor 3. The cutout portion 171 is in a substantially step-like convex shape the top portion of which is disposed on the side of the second outer electrode 12, having a first step portion 171a as a base portion and a second step portion 171b as the top portion. On outer side portions of the cutout remaining portion 17, notch portions 21e and 21f are formed along the outer peripheral edge of the cutout portion 171. The cutout remaining portion 17 has two beam portions 17a and 17b that extend from the side of the first spiral conductor 3 along the outer peripheral edge of the cutout portion 171 to the second outer electrode 12. A radial innermost end portion of the first spiral conductor 3 is electrically connected to a radial innermost end portion of a second spiral conductor 4 (not shown) on the side of a top surface of the flexible board 2 through a via conductor 3a penetrating the flexible board 2. A radial outermost end portion of the second spiral conductor 4 is electrically connected to the second outer electrode 12 through a via conductor (not shown) penetrating through the flexible board 2 and an extended wiring 19c. The extended wiring 19c is formed in or on the beam portion 17a. On the other hand, a first dummy wiring 20c that is connected to the second outer electrode 12 at one end, though is not connected to another conductor in the same plane at the other end, is formed in or on the beam portion 17b.

In the top right corner of the coil substrate 1, a cutout portion 181 penetrating through the coil substrate 1 and a cutout remaining portion 18 extending along an outer peripheral edge of the cutout portion 181 to the fourth outer electrode 14 are formed in an area 54 between the fourth outer electrode 14 and the first spiral conductor 3. The cutout portion 181 is in a substantially step-like convex shape the top portion of which is disposed on the side of the fourth outer electrode 14, having a first step portion 181a as a base portion and a second step portion 181b as the top portion. On outer side portions of the cutout remaining portion 18, notch portions 21g and 21h are formed along the outer peripheral edge of the cutout portion 181. The cutout remaining portion 18 has two beam portions 18a and 18b that extend from the side of the first spiral conductor 3 along the outer peripheral edge of the cutout portion 181 to the fourth outer electrode 14. The fourth outer electrode 14 is electrically connected to the radial outermost end portion of the second spiral conductor 4 through a via conductor (not shown) penetrating through the flexible board 2 and an extended wiring 19d. The extended wiring 19d is formed in or on the beam portion 18a. On the other hand, a first dummy wiring 20d that is connected to the fourth outer electrode 14 at one end, though is not connected to another conductor in the same plane at the other end, is formed in or on the beam portion 18b.

Note that, the first outer electrode 11 and the third outer electrode 13, which are formed at the top left corner and the bottom left corner of the coil substrate 1, respectively, are both electrically connected to the radial outermost end portion of the first spiral conductor 3. The second outer electrode 12 and the fourth outer electrode 14, which are formed at the bottom right corner and the top right corner of the coil substrate 1, respectively, are both electrically connected to the radial innermost end portion of the first spiral conductor 3. Disposing the first to fourth outer electrodes at the four corners provides high stretchability to the mounted flexible board in both of an X direction (the direction of extension of one of a pair of opposite sides of the flexible board 2, i.e., a side that both of the second outer electrode 12 and the third outer electrode 13 adjoin on paper) and a Y direction (a direction orthogonal to the X direction on paper), even when the flexible board bends in any of the directions. Forming the two outer electrodes connected to the radial outermost end portion of the first spiral conductor 3 and the two outer electrodes connected to the radial innermost end portion of the first spiral conductor 3 allows further increase in reliability of mounting of the flexible inductor. Note that, the inductor works as long as one of the outer electrodes is connected to the radial outermost end portion of the first spiral conductor 3 and one of the outer electrodes is connected to the radial innermost end portion of the first spiral conductor 3, so any of the first to fourth outer electrodes may not be electrically connected to the first spiral conductor.

Figure 1B:
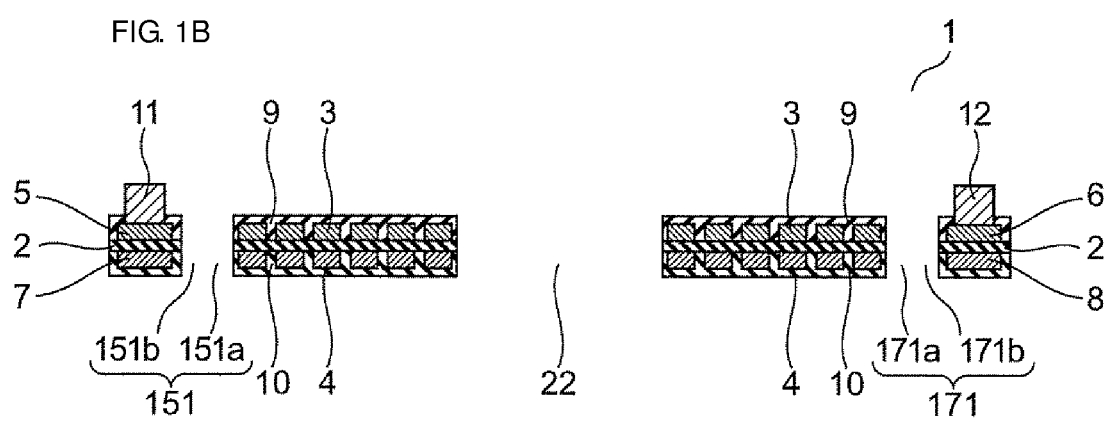
FIG. 1B is a schematic vertical cross sectional view of the flexible inductor including the coil substrate shown in FIG. 1A as taken along line A-A'.

FIG. 1B is a schematic vertical cross sectional view of the flexible inductor including the coil substrate 1 shown in FIG. 1A. The first spiral conductor 3 and the second spiral conductor 4 are laminated so as to sandwich the flexible board 2 therebetween. Gaps of the first spiral conductor 3 are filled with an insulating resin 9, and gaps of the second spiral conductor 4 are filled with an insulating resin 10. The first outer electrode 11 is formed on a base electrode 5, and the second outer electrode 12 is formed on a base electrode 6. Base electrodes 7 and 8 are formed on the top surface of the flexible board 2.

As described above, the outer electrodes are formed at the four corners so that the flexible board has stretchability in both of the X and Y directions, even when the flexible board bends in any of the directions. However, two of the outer electrodes may be dummy electrodes, which are not connected to the spiral conductor. When the bending direction of the mounted flexible board is limited to one direction, the number of the outer electrodes may be two. For example, when the flexible board is bendable only in the X direction, a substantially strip-shaped outer electrode may be formed so as to couple the first outer electrode 11 and the third outer electrode 13 extending along a side that both of the first outer electrode 11 and the third outer electrode 13 adjoin, while another substantially strip-shaped outer electrode may be formed so as to couple the second outer electrode 12 and the fourth outer electrode 14 extending along a side that both of the second outer electrode 12 and the fourth outer electrode 14 adjoin. In this case, at least one cutout portion may be formed so as to penetrate the coil substrate in an area between the first spiral conductor and each of the substantially strip-shaped outer electrodes.

As shown in FIG. 1A, it is preferable that the outer electrode shape be substantially in the shape of a triangle corresponding to the shape of the corner of the coil substrate. This is for the sake of efficient layout of the cutout portions and notch portions.

The flexible board constituting the coil substrate 1 may be made from an insulating resin film or a composite resin film having flexibility, which is cited as, for example, a glass epoxy resin, polyimide, polyethylene naphthalate or the like. The flexible board is substantially in the shape of a rectangle between about 5 mm×5 mm and about 20 mm×20 mm inclusive. The flexible board has a thickness between about 10 μm and about 100 μm inclusive, and preferably has a thickness between about 40 μm and about 70 μm inclusive.

To form the spiral conductor, a specific spiral pattern may be formed by photolithography on a metal layer formed on the flexible board, and subjected to an etching process. To form the metal layer, a metal film may be formed by plating on the flexible board, or a metal foil may be laminated on the flexible board. The conductor may be made of copper or silver having high conductivity. The spiral conductor may be formed on the top surface or the bottom surface of the flexible board, or both of the top surface and the bottom surface thereof. When the spiral conductor is formed on both of the top surface and the bottom surface, the radial outermost end portion of the first spiral conductor 3 is electrically connected to one or both of the first outer electrode 11 and the third outer electrode 13, and the radial innermost end portion of the first spiral conductor 3 is electrically connected to the radial innermost end portion of the second spiral conductor 4 through the via conductor 3a penetrating through the flexible board 2, and the radial outermost end portion of the second spiral conductor 4 is electrically connected to one or both of the second outer electrode 12 and the fourth outer electrode 14 through the via conductor (not shown) penetrating through the flexible board 2. On the other hand, when the spiral conductor is formed on one of the top surface and the bottom surface, for example, on the bottom surface, the radial outermost end portion of the first spiral conductor 3 is electrically connected to one or both of the first outer electrode 11 and the third outer electrode 13 through the extended wirings 19a and 19b, and the radial innermost end portion of the first spiral conductor 3 is electrically connected to an extended wiring (not shown) formed in or on the top surface through the via conductor 3a penetrating through the flexible board 2, and the extended wiring is electrically connected to one or both of the second outer electrode 12 and the fourth outer electrode 14 through the via conductor (not shown) penetrating through the flexible board 2.

As the insulating resin for filling the gaps of the spiral conductor, a thermosetting resin sheet e.g. an epoxy resin sheet is usable. By pressure bonding the epoxy resin sheet onto the coil substrate, the epoxy resin sheet fills the gaps of the spiral conductor by fluidization to be solidified.

As the magnetic sheet, an anisotropic composite magnetic sheet in which flat soft magnetic metal powder is dispersed into a binder resin and the major axis direction of the soft magnetic metal powder is oriented to an in-plane direction of the sheet is usable. The soft magnetic metal powder is not specifically limited, as long as the soft magnetic metal powder has iron as the main ingredient. The magnetic sheet is required to have a high resistance to heat for reflow soldering, and the binder resin is made of a flexible resin having a high heat resistance e.g. a silicone resin, an epoxy resin or the like. When the magnetic sheet is laminated on the coil substrate, an adhesive layer is formed on a surface of the magnetic sheet to stick the magnetic sheet on the coil substrate. Thus, the used adhesive layer also has a high resistance to heat for reflow soldering. The magnetic sheet has a thickness between about 30 μm and about 200 μm inclusive, and preferably has a thickness between about 50 μm and about 100 μm inclusive.

The shape, size and number of the cutout portions are not specifically limited as long as the cutout portions are formed in the area between the spiral conductor and each of the outer electrodes. The cutout portion may be substantially in the shape of a circle, an ellipse, an indefinite form without any angle or the like. For the purpose of further increasing the strength of the area between the spiral conductor and each of the outer electrodes, a plurality of cutout portions of the same size or different sizes may be disposed continuously in an integral manner or away from each other, from the side of the spiral conductor to the side of each outer electrode (layout example 1). For example, the cutout portion may be in a substantially step-like convex shape having a plurality of steps, preferably two or three steps, the top portion of which is disposed on the side of the outer electrode. A plurality of cutout portions of the same size or different sizes may be disposed continuously in an integral manner or away from each other, along the spiral conductor side (layout example 2). The layout examples 1 and 2 may be combined.

The shape, size and number of the notch portions are not specifically limited as long as one or more notch portions are formed in the area between the spiral conductor and each of the outer electrodes, but it is preferable that two notch portions be formed symmetrically with respect to the cutout portion. Note that, the cutout portions and the notch portions are formed only in the coil substrate, but not in the magnetic sheets stuck on the top and bottom surfaces of the coil substrate.

The cutout remaining portion has the plurality of beam portions that extend along the outer peripheral edge of the cutout portion to the outer electrode. Each beam portion preferably has one or more curved portions. It is more preferable that each beam portion have two or more curved portions that alternately bend in opposite directions, thus complying with distortion in the X direction and the Y direction. A bending angle of the curved portion is preferably 90 degrees or more. The plurality of beam portions have top surfaces and bottom surfaces, and the extended wiring is preferably formed in or on the bottom surface of one of the plurality of beam portions so as to connect between the first spiral conductor and one of the outer electrodes. Forming the extended wiring in or on the beam portion facilitates deformation of the extended wiring, thus allowing further preventing a break of a joint portion of the outer electrode. The first dummy wiring is preferably formed in or on the bottom surface of another beam portion having no extended wiring of the plurality of beam portions. This is for the purpose of improving the strength of the beam portion. For example, when a cutout remaining portion has two beam portions, an extended wiring is formed in or on one of the beam portions, while a dummy wiring is formed in or on the other of the beam portions. By forming a dummy wiring instead of an extended wiring, as necessary, the outer electrode is made into a dummy electrode.

The outer electrodes, the cutout portions, and the notch portions are preferably substantially symmetrical in shape or layout with respect to a straight line (diagonal line) that passes through a center point of the spiral conductor and connects corners of the two outer electrodes, in order to allow distortion in both of the X direction and the Y direction. However, when distortion is allowed in only one of the X direction and the Y direction, the substantially symmetrical shape or layout is not necessarily required.

When the second spiral conductor is disposed on the top surface, a second dummy wiring is preferably formed in or on the top surface of at least one of the plurality of beam portions. Forming the second dummy wiring in or on the top surface of the beam portion increases the strength of the cutout remaining portion.

As a method for orienting the major axis direction of the soft magnetic metal powder to the in-plane direction of the sheet, a known method described in Japanese Unexamined Patent Application Publication No. 2009-9985, such as a doctor blading method, a screen printing method, a spray coating method or a hot pressing method is usable.

Note that, the present disclosure uses a first magnetic sheet laminated on the top surface of the coil substrate and a second magnetic sheet laminated on the bottom surface of the coil substrate. The second magnetic sheet is required to have through-holes, notch portions, and the like in accordance with the shape of the outer electrodes, because the second magnetic sheet is required to be laminated on an area other than the outer electrodes.

A method for manufacturing the flexible inductor according to this embodiment will be described below. FIGS. 2A to 2J are schematic vertical cross sectional views showing an example of a manufacturing process, taken along line A-A' of FIG. 1A. Here describes a manufacturing process called subtractive process in which coils and an electrode pattern are formed by etching. However, an additive process (or semi-additive process) may be adopted as the manufacturing process in which the coils and the electrode pattern are formed by plating.

Figure 2A:
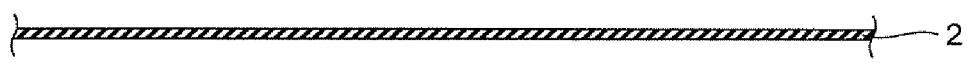
FIG. 2A is a schematic cross sectional view showing an example of a manufacturing process of the flexible inductor according to the first embodiment of the present disclosure.

In a step (a) shown in FIG. 2A, a glass epoxy resin film is prepared as the flexible board 2, and through-holes (not shown) are formed therein in specific positions. The glass epoxy resin film is used here, but a polyimide resin film may be used instead.

In a step (b) shown in FIG. 2B, copper layers 24 and 25 are formed by entirely plating both of a pair of opposite main surfaces (hereinafter called a top surface and a bottom surface) of the flexible board 2 with copper or by laminating metal foil on both of the main surfaces. Thus, an innermost end portion via conductor (not shown) is formed in the through-hole.

In a step (c) shown in FIG. 2C, resist layers are formed on both of the top surface and the bottom surface of the flexible board 2 having the copper layers 24 and 25 formed thereon, and are subjected to an etching process so as to form the second spiral conductor 4 and the base electrodes 7 and 8 on the top surface of the flexible board 2 and so as to form the first spiral conductor 3, the base electrodes 5 and 6, the extended wirings 19a to 19d and the first dummy wirings 20a to 20d on the bottom surface of the flexible board 2. Note that, any one of a start point and an end point of the second spiral conductor 4 formed on the top surface is situated in the vicinity of a middle portion of the flexible board 2, and is connected to the first spiral conductor 3 formed on the bottom surface by providing the innermost end portion via conductor (not shown) in this position. This process connects the spiral conductor on the top surface to the spiral conductor on the bottom surface, in order to form so-called substantially a winding one spiral conductor.

In a step (d) shown in FIG. 2D, insulating resin sheets e.g. epoxy resin sheets are pressure bonded onto both of the top surface and the bottom surface of the flexible board 2, to form the coil substrate 1 in which gaps of the spiral conductors are filled with insulating resin. The insulating resin 9 fills the gaps of the first spiral conductor 3 on the bottom surface, and the insulating resin 10 fills the gaps of the second spiral conductor 4 on the top surface.

In a step (e) shown in FIG. 2E, the cavity 22, the cutout portion 151, the cutout portion 161 (not shown), the cutout portion 171, the cutout portion 181 (not shown) and notch portions (not shown) are provided by cutting out a middle portion of the coil substrate 1 by blasting, punching using a die or the like. Note that, the cavity 22 is not necessarily formed.

In a step (f) shown in FIG. 2F, to form outer electrodes at four corners of the coil substrate 1, the epoxy resin sheet is removed from certain portions at the four corners of the coil substrate 1 by resist patterning or the like, so that outer electrode formation cavities 26a and 26b are formed on the base electrodes 5 and 6.

In a step (g) shown in FIG. 2G, the first outer electrode 11, the second outer electrode 12, the third outer electrode (not shown) and the fourth outer electrode (not shown) are formed by plating in the outer electrode formation cavities 26a and 26b at the four corners of the coil substrate 1. The first to fourth outer electrodes are formed by plating directly from the base electrodes at end portions of an extended wiring (not shown) that connects between the spiral conductor and each of the outer electrodes. A radial innermost end portion of the second spiral conductor 4 formed on the top surface is connected to a radial innermost end portion of the first spiral conductor 3 formed on the bottom surface through an innermost end portion via conductor (not shown) penetrating the flexible board 2. A radial outermost end portion of the second spiral conductor 4 is connected to the second outer electrode 12 through a via conductor (not shown) penetrating the flexible board 2. A radial outermost end portion of the first spiral conductor 3 is connected to the first outer electrode 11 through the extended wiring (not shown). Note that, the thickness of the outer electrode may be thinner or thicker than that of a magnetic sheet, which is stuck thereon afterward, if no problem occurs when mounting. The outer electrodes directly function as electrodes for mounting the flexible inductor.

Figure 2H:
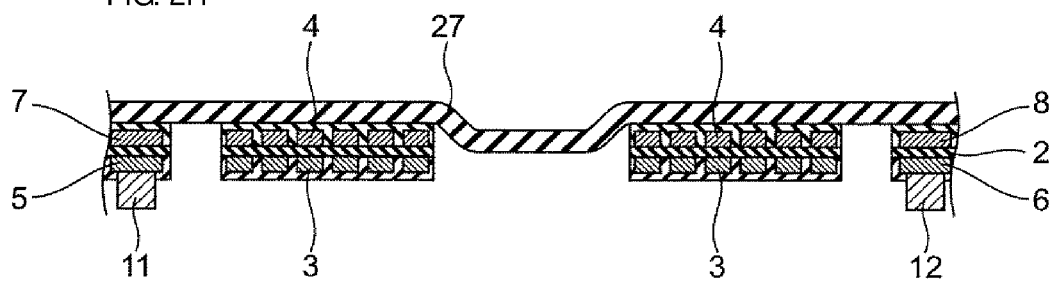
FIG. 2H is a schematic cross sectional view showing the example of the manufacturing process of the flexible inductor according to the first embodiment of the present disclosure.

In a step (h) shown in FIG. 2H, a first magnetic sheet 27, which is made of an anisotropic composite magnetic sheet and has an adhesive layer in its one surface, is stuck on the top surface of the coil substrate 1.

Figure 2I:
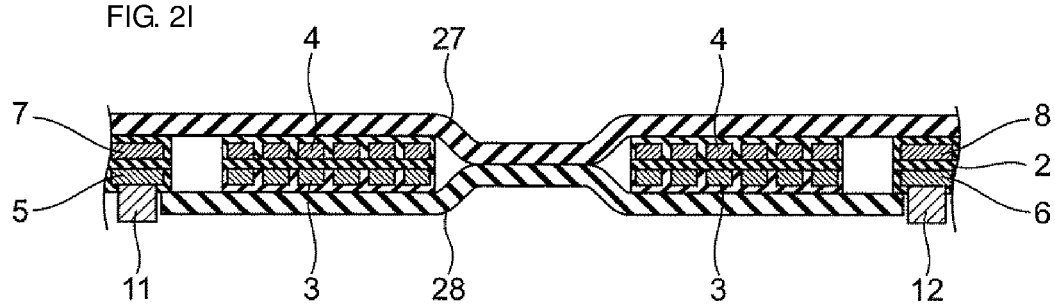
FIG. 2I is a schematic cross sectional view showing the example of the manufacturing process of the flexible inductor according to the first embodiment of the present disclosure.

In a step (i) shown in FIG. 2I, a second magnetic sheet 28, which is made of an anisotropic composite magnetic sheet and has an adhesive layer in its one surface, is stuck and laminated on the bottom surface of the coil substrate 1. In the cavity 22, the first magnetic sheet 27 and the second magnetic sheet 28 are directly stuck together. The anisotropic composite magnetic sheet is a magnetic sheet in which flat soft magnetic metal powder is dispersed into a resin material and the major axis direction of the soft magnetic metal powder is oriented to an in-plane direction of the sheet. The magnetic sheet has a high resistance to heat for reflow soldering, and very thin adhesive layer is formed on one side thereof. The adhesive layer has a high resistance to heat for reflow soldering. The magnetic sheet may be formed by applying or spraying and drying a paint paste in which the soft magnetic metal powder and a solvent are dispersed into the resin material.

Figure 2J:
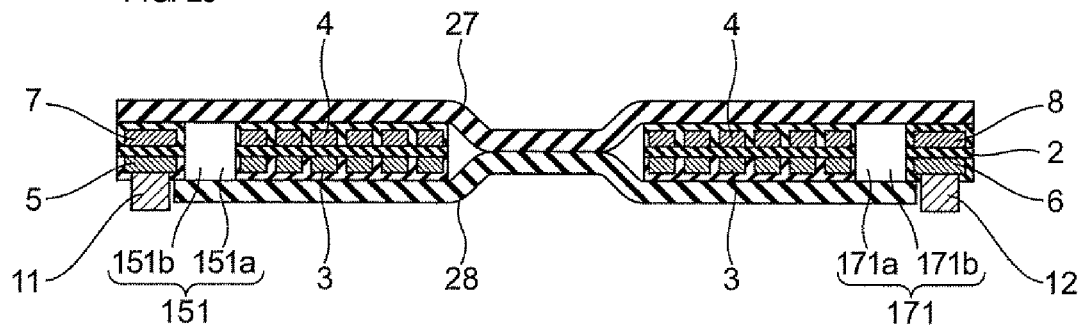
FIG. 2J is a schematic cross sectional view showing the example of the manufacturing process of the flexible inductor according to the first embodiment of the present disclosure.

In a step (j) shown in FIG. 2J, a mother sheet having a lot of flexible inductors is divided into pieces to obtain individual flexible inductors.

According to the flexible inductor of this embodiment, since the areas between the spiral conductor and each of the outer electrodes are easily deformable, it is possible to reduce stress applied to the coil substrate and the outer electrodes, thus improving resistance to mechanical impact and preventing a break in the coil substrate and a break in joint portions of the outer electrodes.

Second Embodiment

Figure 3:
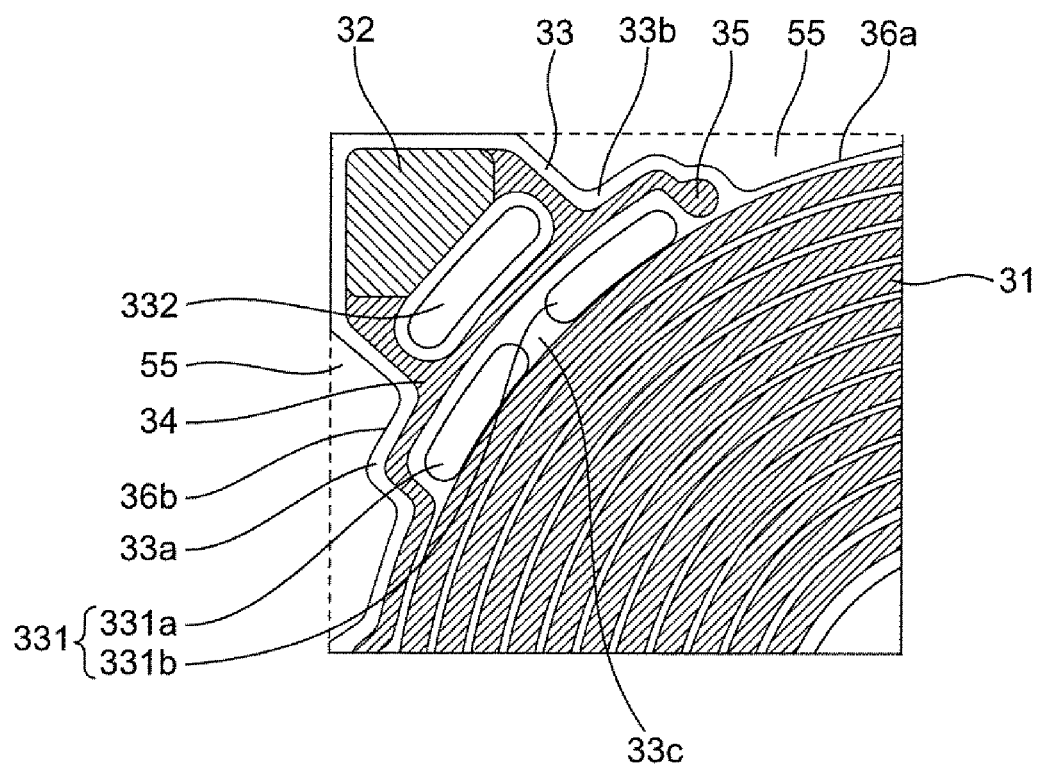
FIG. 3 is a partly enlarged bottom plan view showing an example of the structure of a coil substrate constituting a flexible inductor according to a second embodiment of the present disclosure.

FIG. 3 is a partly enlarged schematic bottom plan view showing the structure of a cutout portion of a flexible inductor according to this embodiment. The flexible inductor according to this embodiment has the same structure as the flexible inductor according to the first embodiment, except that the two cutout portions are disposed away from each other between a spiral conductor side and an outer electrode side.

The flexible inductor according to this embodiment includes a first cutout 331 disposed between a first spiral conductor 31 and a first outer electrode 32, a second cutout 332 disposed away from the first cutout 331 on the side of the first outer electrode 32, and a cutout remaining portion 33 extending along outer peripheral edges of the first cutout 331 and the second cutout 332 to the first outer electrode 32, in an area 55 between the first spiral conductor 31 and the first outer electrode 32. Notch portions 36a and 36b are formed outside the cutout remaining portion. The first cutout 331 further has two cutouts 331a and 331b disposed away from each other along the first spiral conductor 31 side. The cutout remaining portion 33 is constituted of three beam portions 33a, 33b and 33c that extend from the side of the first spiral conductor 31 along outer peripheral edges of the first and second cutouts 331 and 332 to the first outer electrode 32. In or on the beam portion 33a, an extended wiring 34 is formed to electrically connect between a radial outermost end portion of the first spiral conductor 31 and the first outer electrode 32. In or on the beam portion 33b, a first dummy wiring 35 that is connected to the first outer electrode 32 at one end portion, though is not connected to another conductor in the same plane at the other end portion, is formed.

According to this embodiment, just as in the case of the first embodiment, since the area between the spiral conductor and the outer electrode is easily deformable, it is possible to reduce stress applied to the coil substrate and the outer electrodes. Providing the plurality of cutouts that are disposed away from each other between the spiral conductor side and the outer electrode side as the cutout portion allows an increase in the strength of the cutout remaining portion and a further improvement in resistance to mechanical impact. Providing the plurality of cutouts that are disposed away from each other along the spiral conductor side in the cutout portion allows an increase in the strength of the cutout remaining portion and a further improvement in resistance to mechanical impact.

Note that, this embodiment describes a case where the two cutout portions are disposed away from each other between the spiral conductor side and the outer electrode side, by way of example, but the cutout portion may include three or more cutouts that are disposed away from each other between the spiral conductor side and the outer electrode side. The first cutout 331 may be constituted of three or more cutouts that are disposed away from each other along the first spiral conductor 31 side.

Third Embodiment

Figure 4:
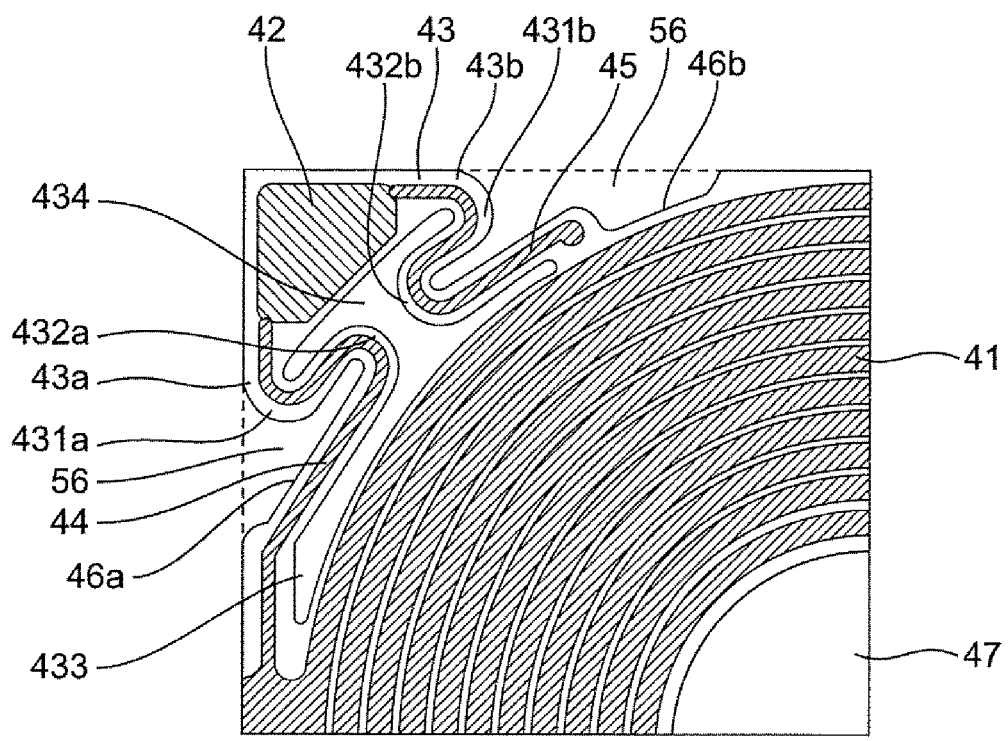
FIG. 4 is a partly enlarged bottom plan view showing an example of the structure of a coil substrate constituting a flexible inductor according to a third embodiment of the present disclosure.

FIG. 4 is a partly enlarged schematic bottom plan view showing the structure of a cutout portion of a flexible inductor according to this embodiment. The flexible inductor according to this embodiment has the same structure as the flexible inductor according to the first embodiment, except that each of a plurality of beam portions has two curved portions in the cutout portion.

The flexible inductor according to this embodiment includes a first cutout 433 and a second cutout 434 that are disposed continuously between a first spiral conductor 41 side and a first outer electrode 42 side, and a cutout remaining portion 43 that extends along outer peripheral edges of the first cutout 433 and the second cutout 434 to the first outer electrode 42, in an area 56 between the first spiral conductor 41 and the first outer electrode 42. Notch portions 46a and 46b are formed outside the cutout remaining portion 43. The cutout remaining portion 43 is constituted of two beam portions 43a and 43b that extend from the side of the first spiral conductor 41 along outer peripheral edges of the first and second cutouts 433 and 434 to the first outer electrode 42. The beam portion 43a has two curved portions 431a and 432a that bend in opposite directions to each other, and the beam portion 43b has two curved portions 431b and 432b that bend in opposite directions to each other. In or on the beam portion 43a, an extended wiring 44 is formed to electrically connect between a radial outermost end portion of the first spiral conductor 41 and the first outer electrode 42. In or on the beam portion 43b, a first dummy wiring 45 that is connected to the first outer electrode 42 at one end portion, though is not connected to another conductor in the same plane at the other end portion, is formed.

According to this embodiment, just as in the case of the first embodiment, since the area between the spiral conductor and the outer electrode is easily deformable, it is possible to reduce stress applied to the coil substrate and the outer electrodes. Since the two curved portions are provided in each of the plurality of beam portions, the beam portions are easily deformable in accordance with bending in both of an X direction and a Y direction, thus allowing a further improvement in resistance to mechanical impact.

Practical Example

The present disclosure will be further described using a practical example, but the present disclosure is not limited to the following practical example.

Samples

Flexible inductors having cutout portions and notch portions manufactured by the method described in the first embodiment were used as samples. Each sample has a length of 3.5 mm, a width of 3.2 mm, and a thickness of 0.3 to 0.4 mm in outside dimensions. For the sake of comparison, samples having no cutout portion and no notch portion were also manufactured.

Test Method

After twelve samples were mounted on a specific circuit board in conformity with JIS (C60068-2-21), bending tests were performed. The bending tests were performed with a bending depth of 20 mm and repeated 1000 times at the maximum, and the presence or absence of unsticking was checked by monitoring a direct current resistance.

Results

It was verified that, although the samples having no cutout portion and no notch portion come unstuck within the repeated bending tests of 1000 times, the samples having the cutout portions and the notch portions did not come unstuck after the repeated bending tests of 1000 times and maintained the function of inductors.

TABLE 1

| SAMPLE NUMBER | PRESENCE OR ABSENCE OF CUTOUT PORTION AND NOTCH PORTION | RESULT OF REPEATED BENDING TESTS |
| --- | --- | --- |
| 1 | ABSENCE | UNSTUCK IN TEST AT 290 TIMES |
| 2 | ABSENCE | UNSTUCK IN TEST AT 102 TIMES |
| 3 | ABSENCE | UNSTUCK IN TEST AT 375 TIMES |
| 4 | ABSENCE | UNSTUCK IN TEST AT 195 TIMES |
| 5 | ABSENCE | UNSTUCK IN TEST AT 925 TIMES |
| 6 | ABSENCE | UNSTUCK IN TEST AT 838 TIMES |
| 7 | PRESENCE | NO UNSTICKING OCCURRED |
| 8 | PRESENCE | NO UNSTICKING OCCURRED |
| 9 | PRESENCE | NO UNSTICKING OCCURRED |
| 10 | PRESENCE | NO UNSTICKING OCCURRED |
| 11 | PRESENCE | NO UNSTICKING OCCURRED |
| 12 | PRESENCE | NO UNSTICKING OCCURRED |

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A flexible inductor comprising:
a coil substrate having a first spiral conductor formed at the coil substrate, a first magnetic sheet laminated over a top surface of the coil substrate, and a second magnetic sheet laminated over a bottom surface of the coil substrate;
a plurality of outer electrodes including a first outer electrode and a second outer electrode, the first and second outer electrodes being disposed at a peripheral portion of the coil substrate, the first outer electrode being electrically connected to an outermost end portion of the first spiral conductor, and the second outer electrode being electrically connected to an innermost end portionof the first spiral conductor; and
cutout portions formed to penetrate through the coil substrate and arranged such that each respective one of the cutout portions is disposed in a respective area between the first spiral conductor and a respective one of the outer electrodes,
wherein each of the respective areas includes a cutout remaining portion formed along an outer peripheral edge of the respective one of the cutout portions between the first spiral conductor and the respective one of the outer electrodes, the cutout remaining portion including a plurality of beam portions each extending along the outer peripheral edge to the respective one of the outer electrodes.

2. The flexible inductor according to claim 1, wherein the coil substrate has a second spiral conductor, and a second dummy wiring is formed at at least one of the plurality of beam portions.

3. The flexible inductor according to claim 1, wherein the plurality of outer electrodes includes four of the outer electrodes, each disposed at a respective one of four corners of the coil substrate.

4. The flexible inductor according to claim 1, wherein at least one of the respective one of the cutout portions includes a plurality of cutouts disposed away from each other.

5. The flexible inductor according to claim 1, wherein at least one of the respective one of the cutout portions includes a plurality of cutouts disposed continuously with each other.

6. The flexible inductor according to claim 1, wherein the first spiral conductor is formed in the bottom surface of the coil substrate or on the bottom surface of the coil substrate.

7. The flexible inductor according to claim 1, wherein each of the respective areas has at least one notch portion formed between the first spiral conductor and the respective one of the outer electrodes.

8. The flexible inductor according to claim 7, wherein the plurality of outer electrodes includes four of the outer electrodes, each disposed at a respective one of four corners of the coil substrate.

9. The flexible inductor according to claim 1, wherein each of the plurality of beam portions has at least one curved portion.

10. The flexible inductor according to claim 9, wherein an extended wiring is formed at one of the plurality of beam portions to connect between the first spiral conductor and the respective one of the plurality of outer electrodes.

11. The flexible inductor according to claim 9, wherein the coil substrate has a second spiral conductor, and a second dummy wiring is formed at at least one of the plurality of beam portions.

12. The flexible inductor according to claim 9, wherein the plurality of outer electrodes includes four of the outer electrodes, each disposed at a respective one of four corners of the coil substrate.

13. The flexible inductor according to claim 1, wherein an extended wiring is formed at one of the plurality of beam portions to connect between the first spiral conductor and the respective one of the plurality of outer electrodes.

14. The flexible inductor according to claim 13, wherein the coil substrate has a second spiral conductor, and a second dummy wiring is formed at at least one of the plurality of beam portions.

15. The flexible inductor according to claim 13, wherein the plurality of outer electrodes includes four of the outer electrodes, each disposed at a respective one of four corners of the coil substrate.

16. The flexible inductor according to claim 13, wherein a first dummy wiring is formed at another one of the beam portions other than the one of the plurality of beam portions having the extended wiring.

17. The flexible inductor according to claim 16, wherein the coil substrate has a second spiral conductor, and a second dummy wiring is formed at at least one of the plurality of beam portions.

18. The flexible inductor according to claim 16, wherein the plurality of outer electrodes includes four of the outer electrodes, each disposed at a respective one of four corners of the coil substrate.

* * * * *